(12) United States Patent
Gong

(10) Patent No.: US 10,224,416 B2
(45) Date of Patent: Mar. 5, 2019

(54) METHOD FOR MANUFACTURING LOW-TEMPERATURE POLY-SILICON THIN FILM TRANSISTOR, LOW-TEMPERATURE POLY-SILICON THIN FILM TRANSISTOR AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Kui Gong, Beijing (CN)

(73) Assignees: BOE TECHNOLOGY GROUP CO., LTD. (CN); HEFEI BOE OPTOELECTRONICS TECHNOLOGY CO., LTD. (CN)

(*) Notice: Subject to any disclaimer, the term of this patent is extended or adjusted under 35 U.S.C. 154(b) by 0 days.

(21) Appl. No.: 15/809,673

(22) Filed: Nov. 10, 2017

(65) Prior Publication Data
US 2018/0294344 A1 Oct. 11, 2018

(30) Foreign Application Priority Data
Apr. 11, 2017 (CN) .......................... 2017 1 0233784

(51) Int. Cl.
*H01L 29/66* (2006.01)
*H01L 21/027* (2006.01)
*H01L 29/786* (2006.01)
*H01L 21/265* (2006.01)
*H01L 21/306* (2006.01)
*H01L 21/02* (2006.01)
(Continued)

(52) U.S. Cl.
CPC .... *H01L 29/66757* (2013.01); *H01L 21/0214* (2013.01); *H01L 21/0217* (2013.01); *H01L 21/0273* (2013.01); *H01L 21/02164* (2013.01); *H01L 21/02532* (2013.01); *H01L 21/02592* (2013.01); *H01L 21/02675* (2013.01); *H01L 21/26513* (2013.01); *H01L 21/30604* (2013.01); *H01L 21/31111* (2013.01); *H01L 27/1222* (2013.01); *H01L 27/1274* (2013.01); *H01L 27/1288* (2013.01); *H01L 29/167* (2013.01); *H01L 29/78621* (2013.01); *H01L 29/78675* (2013.01)

(58) Field of Classification Search
None
See application file for complete search history.

(56) References Cited

U.S. PATENT DOCUMENTS

2008/0017887 A1* 1/2008 Nagata .............. H01L 29/66757
257/204
2016/0247839 A1* 8/2016 Dai ........................ H01L 21/34
(Continued)

*Primary Examiner* — Asok K Sarkar
(74) *Attorney, Agent, or Firm* — Brooks Kushman P.C.

(57) ABSTRACT

The present disclosure provides a method for manufacturing an LTPS TFT, including steps of: forming patterns of a p-Si layer and a protection layer on a base substrate, the protection layer covering the p-Si layer; performing a first ion injection operation so as to inject ions through the protection layer into the p-Si layer, thereby to form a heavily-drain-doped region; and performing an ashing operation and performing a second ion injection operation, to form a pattern of an LTPS active layer including a heavily-drain-doped region, a lightly-drain-doped region and an undoped region.

18 Claims, 5 Drawing Sheets

(51) Int. Cl.
    *H01L 27/12*     (2006.01)
    *H01L 21/311*     (2006.01)
    *H01L 29/167*     (2006.01)

(56) References Cited

U.S. PATENT DOCUMENTS

2017/0162706 A1*   6/2017   Lu .................... H01L 29/78621
2017/0194151 A1*   7/2017   Zhang ............... H01L 21/26513

* cited by examiner

METHOD FOR MANUFACTURING LOW-TEMPERATURE POLY-SILICON THIN FILM TRANSISTOR, LOW-TEMPERATURE POLY-SILICON THIN FILM TRANSISTOR AND DISPLAY DEVICE

CROSS-REFERENCE TO RELATED APPLICATION

This application claims priority to Chinese Patent Application No. 201710233784.6 filed on Apr. 11, 2017, which is incorporated herein by reference in its entirety.

TECHNICAL FIELD

The present disclosure relates to the field of display technology, in particular to a method for manufacturing a low-temperature poly-silicon (LTPS) thin film transistor (TFT), the LTPS TFT, and a display device.

BACKGROUND

Recently, along with the rapid development of the display technology, an LTPS TFT has emerged so as to replace an original amorphous silicon (a-Si) TFT. The LTPS TFT has various advantages. For example, its electron mobility may be more than 200 $cm^2$/V-sec, so it is able to, on one hand, effectively reduce an area of the TFT and improve an aperture ratio, and on the other hand, reduce the overall power consumption while increasing a display brightness value. For another example, due to the relatively high electron mobility, it is able to integrate a part of driving circuits into a substrate, so as to reduce the number of driving integrated circuits (ICs), thereby to significantly improve the reliability of a liquid crystal display (LCD) panel and remarkably reduce the manufacture cost. Hence, the LTPS TFT has currently become a research focus in the field of display technology.

During the manufacture of the LTPS TFT, in order to form an excellent electrical connection between a source/drain electrode and an LTPS active layer and suppress the occurrence of leakage current, it is necessary to dope the LTPS active layer through an ion injection process, so as to form a heavily-drain-doped region and a lightly-drain-doped region. Usually, a half-tone or gray-tone mask plate is adopted in the related art so as to heavily and lightly dope the LTPS active layer. However, it is found that a p-Si layer may be damaged or oxidized, and thereby a display effect may be adversely affected.

SUMMARY

An object of the present disclosure is to provide a method for manufacturing an LTPS TFT, the LTPS TFT, and a display device, so as to at least partially prevent the p-Si layer from being damaged and oxidized.

In one aspect, the present disclosure provides in some embodiments a method for manufacturing an LTPS TFT, including steps of: forming patterns of a p-Si layer and a protection layer on a base substrate, the protection layer covering the p-Si layer; performing a first ion injection operation so as to inject ions through the protection layer into the p-Si layer, thereby to form a heavily-drain-doped region; and performing an ashing operation and performing a second ion injection operation, so as to form a pattern of an LTPS active layer including a heavily-drain-doped region, a lightly-drain-doped region and an undoped region.

In a possible embodiment of the present disclosure, the step of forming the patterns of the p-Si layer and the protection layer on the base substrate includes: depositing a buffer layer, an a-Si film and a protection film sequentially onto the base substrate; subjecting the a-Si film to crystallization so as to form a p-Si film; and forming the patterns of p-Si layer and the protection layer through a patterning process, the pattern of the protection layer being substantially identical to the pattern of the p-Si layer.

In a possible embodiment of the present disclosure, the step of performing the first ion injection operation so as to inject the ions through the protection layer into the p-Si layer, thereby to form the heavily-drain-doped region includes: applying a photoresist onto the base substrate with the patterns of the p-Si layer and the protection layer, and gradually exposing and developing the photoresist using a half-tone mask plate or a grey-tone mask plate, so as to form an unexposed region corresponding to the undoped region, a partially-exposed region corresponding to the lightly-drain-doped region, and a fully-exposed region corresponding to the other regions including the heavily-drain-doped region; and performing the first ion injection operation, so as to inject the ions through the protection layer into a portion of the p-Si layer corresponding to the fully-exposed region, thereby to form the heavily-drain-doped region.

In a possible embodiment of the present disclosure, the step of performing the ashing operation and performing the second ion injection operation, so as to form the pattern of the LTPS active layer including the heavily-drain-doped region, the lightly-drain-doped region and an undoped region includes: performing the ashing operation on the photoresist and removing the photoresist corresponding to the partially-exposed region; performing the second ion injection operation so as to inject the ions into a portion of the p-Si layer corresponding to the partially-exposed region, thereby to form the lightly-drain-doped region; and removing the remaining photoresist, so as to form the pattern of the LTPS active layer including the heavily-drain-doped region, the lightly-drain-doped region and the undoped region.

In a possible embodiment of the present disclosure, prior to performing the second ion injection operation, the manufacturing method further includes etching off portions of the protection layer corresponding to the fully-exposed region and the partially-exposed region.

In a possible embodiment of the present disclosure, subsequent to the step of removing the remaining photoresist, the manufacturing method further includes etching off a portion of the protection layer corresponding to the unexposed region.

In a possible embodiment of the present disclosure, the protection layer is made of silicon nitride, silicon oxide or both. In the case that the protection layer is a composite film made of silicon nitride and silicon oxide, it has a thickness of 5 nm~20 nm.

In a possible embodiment of the present disclosure, the composite film has a thickness of 10 nm.

In a possible embodiment of the present disclosure, the manufacturing method further includes forming patterns of a gate electrode, a source electrode and a drain electrode.

In a possible embodiment of the present disclosure, the step of forming the patterns of the gate electrode, the source electrode and the drain electrode includes: depositing a first insulation layer and a gate metal film sequentially, and forming the gate electrode through a patterning process; depositing a second insulation layer, and forming an insulation layer via-hole through a patterning process; and depositing a source/drain metal film and forming the source electrode and the drain electrode through a patterning process, the source electrode and the drain electrode being connected to the portion of the p-Si active layer corresponding to the heavily-drain-doped region.

In a possible embodiment of the present disclosure, the buffer layer is made of silicon nitride, silicon oxide or silicone oxynitride.

In a possible embodiment of the present disclosure, the buffer layer is of a single-layered, double-layered or multi-layered structure.

In a possible embodiment of the present disclosure, the a-Si film is subjected to crystallization using a laser beam, so as to form the p-Si film.

In a possible embodiment of the present disclosure, the photoresist at the unexposed region corresponding to the undoped region has a first thickness, the photoresist at the partially-exposed region corresponding to the lightly-drain-doped region has a second thickness, no photoresist is located at the fully-exposed region corresponding to the regions including the heavily-drain-doped region, and the first thickness is substantially greater than the second thickness.

In a possible embodiment of the present disclosure, the heavily-drain-doped region and the lightly-drain-doped region are formed through one single patterning process using a half-tone mask plate or a grey-tone mask plate.

In a possible embodiment of the present disclosure, N-type ions are used for the second ion injection operation.

In a possible embodiment of the present disclosure, the N-type ions are phosphorus ions.

In a possible embodiment of the present disclosure, another lightly-drain-doped region is added between the heavily-drain-doped region and the undoped region.

In another aspect, the present disclosure provides in some embodiments an LTPS TFT manufactured using the above-mentioned method.

In yet another aspect, the present disclosure provides in some embodiments a display device including the above-mentioned LTPS TFT.

According to the method for manufacturing the LTPS TFT, the LTPS active layer may be formed merely through one single patterning process using the half-tone or grey-tone mask plate, so it is able to simplify a manufacture process. In addition, through the protection layer on the p-Si layer, it is able to protect the p-Si layer during the ashing operation on the photoresist, thereby to prevent the p-Si layer from being damaged and oxidized. Hence, it is able to prevent a contact resistance between the source/drain electrode and the heavily-drain-doped region from being increased, and prevent the occurrence of defective electrical connection, thereby to improve the reliability of the LTPS TFT as well as the quality of the final product. Moreover, the method in the embodiments of the present disclosure may be implemented by slightly changing a conventional manufacture process, so it may be widely used in the field.

Of course, it is unnecessary for any product or method in the embodiments of the present disclosure to have all the above-mentioned advantages. The other features and advantages of the present disclosure will be described hereinafter, and parts of them will become more apparent or will be understood through the implementation of the present disclosure. The objects and the other advantages of the present disclosure may be achieved through the description, the claims and structures specified in the drawings.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure. A shape and a size of each member in the drawings are for illustrative purposes only, but shall not be used to reflect an actual scale.

Figure 1:
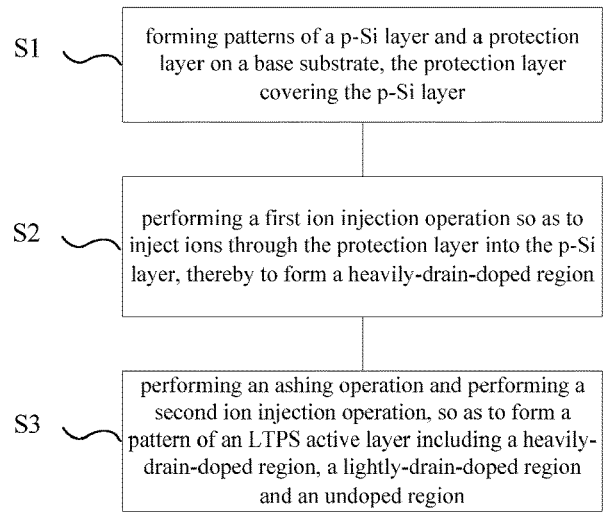
FIG. 1 is a flow chart of a method for manufacturing an LTPS TFT according to one embodiment of the present disclosure.
Figure 2:
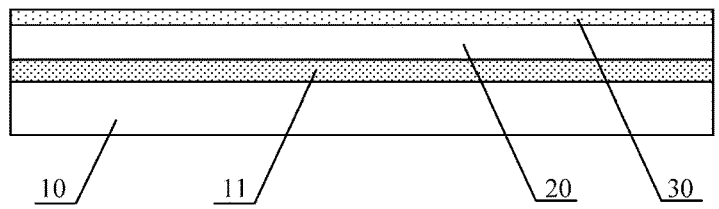
FIG. 2 is a schematic view showing the LTPS TFT after the deposition of a buffer layer, an a-Si film and a protection film according to the first embodiment of the present disclosure.

REFERENCE SIGN LIST 10 base substrate
11 buffer layer
12 LTPS active layer 13 first insulation layer
14 gate electrode
15 second insulation layer
16 source/drain electrode
20 a-Si film
21 p-Si film
22 p-Si layer
30 protection film
31 protection layer
100 photoresist
121 heavily-drain-doped region
122 lightly-drain-doped region
123 undoped region

DETAILED DESCRIPTION

The present disclosure will be described hereinafter in conjunction with the drawings and embodiments. The following embodiments are for illustrative purposes only, but shall not be used to limit the scope of the present disclosure. It should be appreciated that, the embodiments of the present disclosure and the features therein may be combined in any form in the case of no conflict.

Usually, a half-tone or gray-tone mask plate is adopted in the related art so as to heavily and lightly dope an LTPS active layer. However, a p-Si layer may be damaged or oxidized, and thereby a display effect may be adversely affected. It is found that, during an ashing operation on a photoresist using a half-tone or grey-tone mask plate, due to the use of $O_2$ plasmas, a heavily-drain-doped region of the p-Si layer may be bombarded with the plasmas and thereby damaged, and meanwhile the heavily-drain-doped region may be oxidized. At this time, a contact resistance between a source/drain electrode and the heavily-drain-doped region may increase and even a defective electrical connection may occur.

In order to prevent the p-Si layer from being damaged and oxidized, the present disclosure provides in some embodiments a method for manufacturing an LTPS TFT which, as shown in FIG. 1, includes: Step S1 of forming patterns of a p-Si layer and a protection layer on a base substrate, the protection layer covering the p-Si layer; Step S2 of performing a first ion injection operation so as to inject ions through the protection layer into the p-Si layer, thereby to form a heavily-drain-doped region; and Step S3 of performing an ashing operation and performing a second ion injection operation, so as to form a pattern of an LTPS active layer including a heavily-drain-doped region, a lightly-drain-doped region and an undoped region.

According to the method in the embodiments of the present disclosure, through the protection layer on the p-Si layer, it is able to protect the heavily-drain-doped region during the ashing operation on a photoresist, thereby to prevent the p-Si layer from being damaged and oxidized. As compared with the conventional manufacture process, it is able to prevent a contact resistance between a source/drain electrode and the heavily-drain-doped region from being increased and prevent the occurrence of defective electrical connection due to the damaged and oxidized p-Si layer, thereby to improve the reliability of the LTPS TFT.

Step S1 includes: Step S11 of depositing a buffer layer, an a-Si film and a protection film sequentially onto the base substrate; Step S12 of subjecting the a-Si film to crystallization so as to form a p-Si film; and Step S13 of forming the patterns of p-Si layer and the protection layer through a patterning process, the pattern of the protection layer being substantially identical to the pattern of the p-Si layer.

Step S2 includes: Step S21 of applying a photoresist onto the base substrate with the patterns of the p-Si layer and the protection layer, and gradually exposing and developing the photoresist using a half-tone mask plate or a grey-tone mask plate, so as to form an unexposed region corresponding to the undoped region, a partially-exposed region corresponding to the lightly-drain-doped region, and a fully-exposed region corresponding to the other regions including the heavily-drain-doped region; and Step S22 of performing the first ion injection operation, so as to inject the ions through the protection layer into a portion of the p-Si layer corresponding to the fully-exposed region, thereby to form the heavily-drain-doped region.

Step S3 includes: Step S31 of performing the ashing operation on the photoresist and removing the photoresist corresponding to the partially-exposed region; Step S32 of performing the second ion injection operation so as to inject the ions into a portion of the p-Si layer corresponding to the partially-exposed region, thereby to form the lightly-drain-doped region; and Step S33 of removing the remaining photoresist, so as to form the pattern of the LTPS active layer including the heavily-drain-doped region, the lightly-drain-doped region and the undoped region.

Subsequent to Step S31 and prior to Step S32, the method further includes etching off portions of the protection layer corresponding to the fully-exposed region and the partially-exposed region.

Subsequent to Step S33, the method further includes etching off a portion of the protection layer corresponding to the unexposed region.

Subsequent to the step of forming the pattern of the LTPS active layer, the method further includes forming patterns of a gate electrode, a source electrode and a drain electrode.

The present disclosure will be described hereinafter in more details on the basis of a manufacture procedure of the LTPS TFT.

First Embodiment

FIG. 2 through FIG. 10 are schematic views showing the manufacture of the LTPS TFT according to the first embodiment of the present disclosure. In this embodiment, the so-called "patterning process" includes such conventional mature processes as depositing layers, applying a photoresist, exposing with a mask plate, developing, etching and removing the photoresist. Any known processes such as sputtering, evaporation and chemical vapor deposition (CVD) may be used for the deposition, any known applying processes may be used for applying the photoresist, and any known etching processes may be used, which will not be particularly defined herein.

Through a first patterning process, the patterns of the p-Si layer and the protection layer may be formed on the base substrate. The step of forming the patterns of the p-Si layer and the protection layer includes depositing a buffer layer 11, an a-Si film 20 and a protection film 30 sequentially onto the base substrate 10. The base substrate 10 may be a glass substrate or a quartz substrate. The buffer layer 11 may be made of silicon nitride (SiNx), silicon oxide (SiOx) or silicon oxynitride (Si(ON)x), and it may be of a single-layered, double-layered or multi-layered structure. The buffer layer functions as to prevent metal ions in the base substrate from being diffused into the active layer, thereby to prevent such characteristics of the LTPS TFT as a threshold voltage and a leakage current from being adversely affected. An appropriate buffer layer may be used to improve the quality of a back interface of the p-Si layer, thereby to prevent the occurrence of the leakage current for the back interface of the p-Si layer, reduce the thermal conductivity, and reduce a cooling rate of silicon that has been heated by a laser beam. The protection film 30 may be made of silicon nitride, silicon oxide or both, and it has a thickness of 5 nm~20 nm. In a possible embodiment of the present disclosure, the protection film 30 has a thickness of 10 nm.

Figure 3:
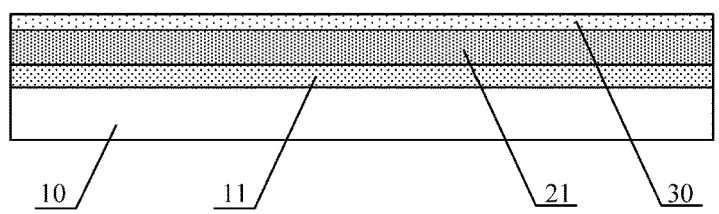
FIG. 3 is another schematic view showing the LTPS TFT after the a-Si film is subjected to crystallization to form a p-Si film according to the first embodiment of the present disclosure.

The a-Si film 20 is subjected to crystallization using a laser beam, so as to form a p-Si film 21, as shown in FIG. 3. The laser beam may be generated by a XeCl, ArF, KrF or XeF laser. These excimer lasers may be used to generate a short-pulse laser beam at an ultraviolet band toward the a-Si film, and the a-Si film may absorb laser energy quickly, so as to be melted and re-crystallized.

Figure 4:
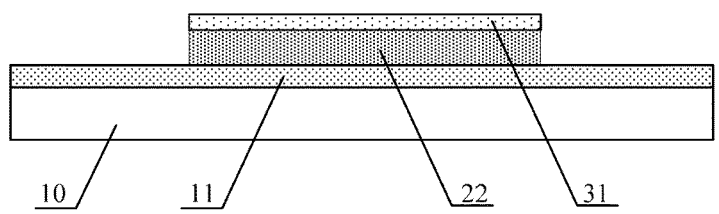
FIG. 4 is yet another schematic view showing the LTPS TFT after the formation of patterns of a p-Si layer and a protection layer according to the first embodiment of the present disclosure.

A photoresist 100 may be applied onto the protection film 30, and then exposed and developed using a single-tone mask plate, the protection film 30 and the p-Si film 21 may be etched, and then the remaining photoresist may be removed, so as to from the patterns of the p-Si layer 22 and the protection layer 31. The protection layer 31 covers the p-Si layer 22 partially or entirely. Here, the pattern of the protection layer is substantially identical to the pattern of the p-Si layer, as shown in FIG. 4.

Through a second patterning process, a pattern of an LTPS active layer including a heavily-drain-doped (HDD) region, a lightly-drain-doped (LDD) and an undoped region is formed on the base substrate with the patterns of the p-Si layer and the protection layer through a half-tone or grey-tone mask plate. The step of forming the pattern of the LTPS active layer may include the following steps.

Figure 5:
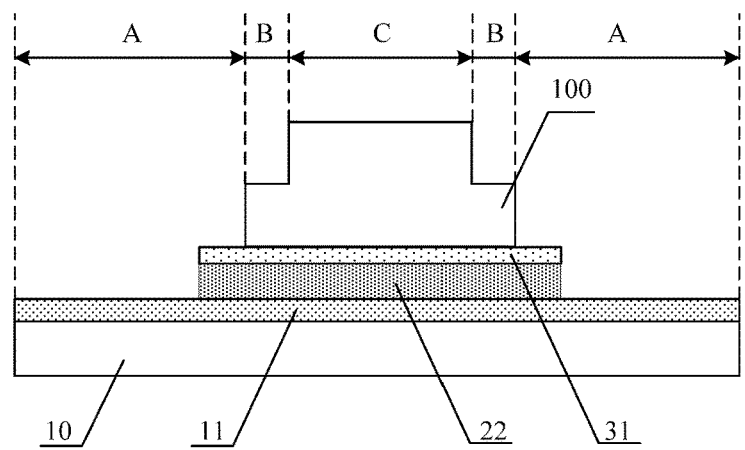
FIG. 5 is still yet another schematic view showing the LTPS TFT after a photoresist is exposed and developed according to the first embodiment of the present disclosure.

The photoresist 100 may be applied onto the base substrate with the patterns of the p-Si layer 22 and the protection layer 31. Next, the photoresist 100 may be gradually exposed and developed using a half-tone or grey-tone mask plate, as to form an unexposed region indicated by "C" corresponding to the undoped region and having the photoresist at a first thickness, a partially-exposed region indicated by "B" corresponding to the LDD region and having the photoresist at a second thickness substantially smaller than the first thickness, and a fully-exposed region indicated by "A" corresponding to the other regions including the HDD region and having no photoresist, as shown in FIG. 5.

Figure 6:
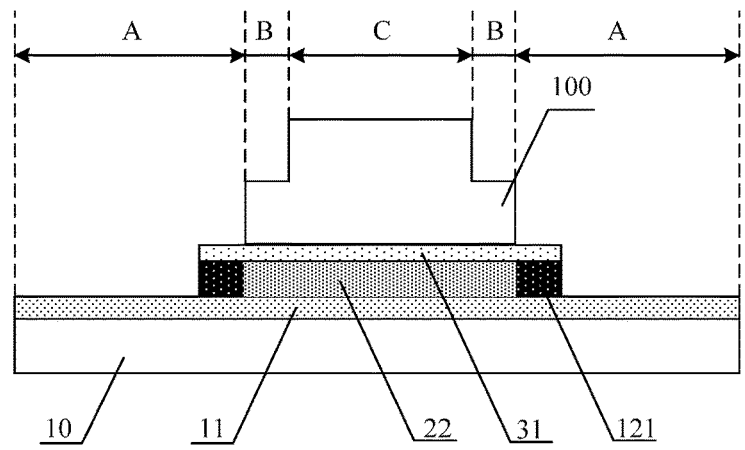
FIG. 6 is still yet another schematic view showing the LTPS TFT after the formation of a heavily-drain-doped region according to the first embodiment of the present disclosure.

Next, a first ion injection operation may be performed on the p-Si layer 22 corresponding to the fully-exposed region "A". The unexposed region "C" and the partially-exposed region "B" of the p-Si layer 22 are shielded by the photoresist 100, i.e., the LDD region and the undoped region are protected by the photoresist, and the HDD region corresponding to the fully-exposed region "A" is not protected by the photoresist. Hence, ions may pass through the protection layer 31 and enter the p-Si layer 22 corresponding to the fully-exposed region "A", so as to form the HDD region 121 at two sides of the p-Si layer, as shown in FIG. 6. During the actual manufacture, N-type ions, e.g., phosphorous ions, are injected for the first ion injection operation. The protection layer 31 has a relatively small thickness, and the N-type ions may pass through the protection layer 31 and enter the p-Si layer 22, so it is able to ensure an ion injection effect. For the ion injection, an ion injection method using a mass-synchrometer. Instead, an ion atmosphere injection method, a plasma injection method or a solid-state diffusion method without using a mass-synchrometer may be used.

Figure 7:
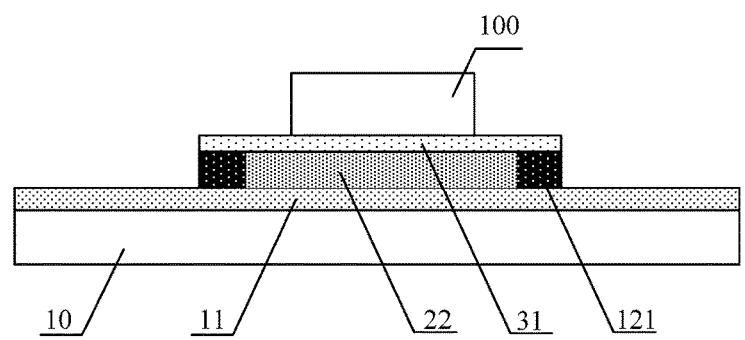
FIG. 7 is still yet another schematic view showing the LTPS TFT after an ashing operation according to the first embodiment of the present disclosure.

Next, an ashing operation may be performed on the photoresist 100, so as to remove a portion of the entire photoresist 100 having the second thickness, i.e., remove the photoresist corresponding to the partially-exposed region "B", thereby to expose the LDD region and reduce the thickness of the photoresist corresponding to the unexposed region "C", as shown in FIG. 7. Due to the protection layer on the p-Si layer, during the ashing operation on the photoresist, it is able to effectively prevent the HDD region 121 of the p-Si layer from being directly bombarded with $O_2$ plasmas, thereby to prevent the HDD region from being damaged and oxidized.

Figure 8:
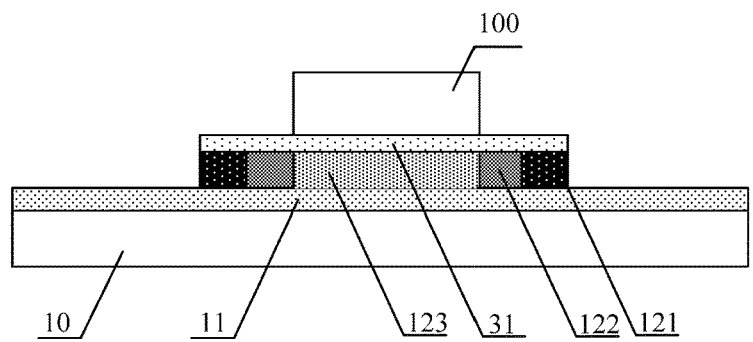
FIG. 8 is still yet another schematic view showing the LTPS TFT after the formation of a lightly-drain-doped region according to the first embodiment of the present disclosure.

Next, a second ion injection operation may be performed on portions of the p-Si layer 22 corresponding to the fully-exposed region "A" and the partially-exposed region "B". The unexposed region "C" is shielded by the photoresist 100, i.e., the undoped region is protected by the photoresist, and the LDD region corresponding to the partially-exposed region and the HDD region corresponding to the fully-exposed region are not protected by the photoresist, so ions may pass through the protection layer 31 and enter the portions of the p-Si layer 22 corresponding to the fully-exposed region "A" and the partially-exposed region "B", so as to form the LDD region 122 between the HDD region 121 and the undoped region 123, as shown in FIG. 8. An ion concentration at the LDD region 122 is substantially smaller than that at the HDD region 121, and the undoped region 123 is a channel region of the TFT. During the actual manufacture, N-type ions, e.g., phosphorous ions, are used for the second ion injection operation.

Figure 9:
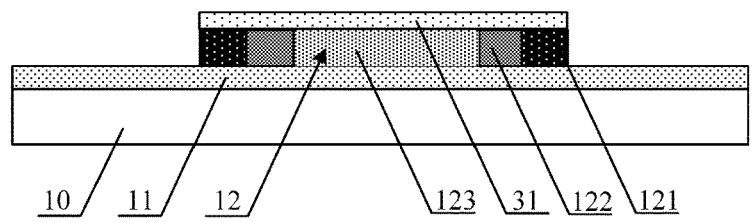
FIG. 9 is still yet another schematic view showing the LTPS TFT after the formation of a pattern of an LTPS active layer according to the first embodiment of the present disclosure.

Then, the remaining photoresist may be removed, so as to form the patterns of the LTPS active layer 12 and the protection layer 31. The LTPS active layer 12 includes the undoped (n) region 123 in the middle, the HDD (n+) region 121 at two sides, and the LDD (n−) region 122 arranged between the undoped region 123 and the HDD region 121. The protection layer 31 covers the LTPS active layer 12, and the pattern of the protection layer 31 is substantially identical to the pattern of the LTPS active layer 12, as shown in FIG. 9. In this embodiment, in order to form excellent electrical connection between a source/drain electrode and the LTPS active layer, a source/drain region of the LTPS active layer is heavily doped using an ion injection process so as to form the HDD region, and the source/drain electrode is connected to the HDD region of the LTPS active layer, so it is able to reduce the contact resistance, thereby to achieve a better TFT electrical characteristic. In addition, the shorter a semiconductor region, the more obvious a short-channel effect. Abnormality may occur for the TFT characteristics due to the short-channel effect, e.g., a cut-off voltage Vth of the TFT and a leakage current Ioff may become larger. In order to prevent the occurrence of the abnormality, another LDD region may be added between the HDD region and the undoped region, i.e., a resistor may be connected in series between the source/drain electrode and the channel, so as to reduce a horizontal electric field of the channel, thereby to suppress the occurrence of the leakage current. In addition, the HDD region and the LDD region may be formed merely through one single patterning process using a half-tone or grey-tone mask plate, so it is able to simplify the manufacture process.

Figure 10:
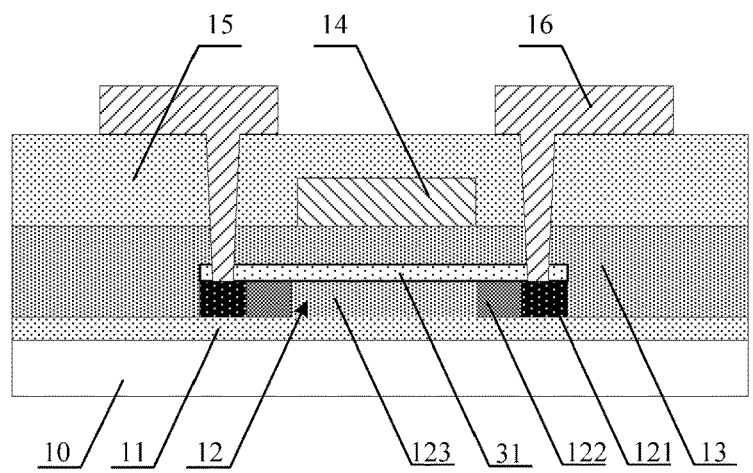
FIG. 10 is still yet another schematic view showing the LTPS TFT according to the first embodiment of the present disclosure.

Subsequently, patterns of a gate electrode, a source electrode and a drain electrode may be formed sequentially on the base substrate with the above-mentioned patterns. The step of forming the patterns of the gate electrode, the source electrode and the drain electrode includes the following steps. A first insulation layer 13 covering the entire base substrate 10 and a gate metal film may be deposited sequentially, the gate electrode 14 may be formed through a patterning process using a single-tone mask plate. Next, a second insulation layer 15 may be deposited in such a manner as to cover the gate electrode 14 and the entire base substrate 10, and an insulation layer via-hole may be formed above the HDD region 121 of the LTPS active layer 12 through a patterning process using a single-tone mask plate. The insulation layer via-hole penetrates through the second insulation layer 15, the first insulation layer 13 and the protection layer 31, so as to expose a surface of the HDD region 121. Then, a source/drain metal film may be deposited, and source/drain electrodes 16 may be formed through a patterning process using a single-tone mask plate. The source/drain electrodes 16 include the source electrode and the drain electrode arranged at two sides of a channel region respectively. The source electrode and the drain electrode are connected to the HDD region 121 of the p-Si active layer 12 through the insulation layer via-hole, so as to from the LTPS TFT, as shown in FIG. 10. In actual use, the gate metal film and the source/drain metal film may each be made of Pt, Ru, Au, Ag, Mo, Cr, Al, Ta, Ti or W, or an alloy thereof. The first insulation layer and the second insulation layer may each be made of silicon nitride, silicon oxide or both.

During the implementation, there may be one or two LDD regions. For example, in the case that the LTPS TFT serves as a pixel switch, it is necessary to provide two LDD regions, and in the case that the LTPS TFT serves a peripheral switch element, it is merely necessary to provide one LDD region at a side of the drain electrode.

The LTPS TFT manufactured according to this embodiment includes: the base substrate 10; the buffer layer 11 arranged on the base substrate 10; the LTPS active layer 12 arranged on the buffer layer 11 and including the undoped region 123, the LDD region 122 and the HDD region 121; the protection layer 31 arranged on the LTPS active layer 12, the pattern of the protection layer 31 being substantially identical to that of the LTPS active layer 12; the first insulation layer 13 covering the protection layer 31; the gate electrode 14 arranged on the first insulation layer 13; the second insulation layer 15 covering the gate electrode 14; and the source/drain electrodes 16 arranged on the second insulation layer 15 and connected to the HDD region 121 of the LTPS active layer 12 through the insulation layer via-hole.

According to the method in the first embodiment of the present disclosure, the LTPS active layer may be formed merely through one single patterning process using a half-tone or grey-tone mask plate. In addition, due to the protection layer on the p-Si layer, it is able to effectively protect the HDD region during the ashing operation on the photoresist. As a result, it is able to prevent the p-Si layer from being damaged and oxidized, simplify the manufacture process and improve the product quality.

Second Embodiment

FIG. 10 through FIG. 14 are schematic view showing the manufacture of the LTPS TFT according to the second embodiment of the present disclosure. The second embodiment is an alternation of the first embodiment, and differs from the first embodiment in that, after the ashing operation on the photoresist, the protection layer outside the unexposed region is etched off first and then the second ion injection operation is performed.

In this embodiment, a manufacture procedure from the step of depositing the buffer layer, the a-Si film and the protection film to the step of performing the ashing operation on the photoresist maybe identical to that in the first embodiment, as shown in FIG. 2 through FIG. 7. During the ashing operation on the photoresist, due to the protection layer 31 on the HDD region 121, so it is able to effectively prevent the HDD region 121 of the p-Si layer from being directly bombarded with the $O_2$ plasmas, thereby to prevent the HDD region of the p-Si layer from being damaged and oxidized.

Figure 11:
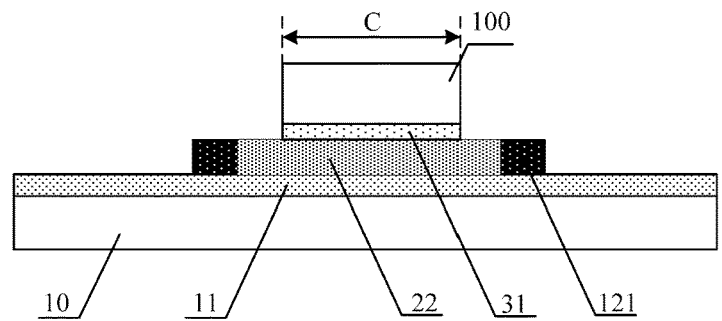
FIG. 11 is a schematic view showing the LTPS TFT after the protection layer corresponding to an unexposed region is etched off according to the second embodiment of the present disclosure.

After the ashing operation on the photoresist, the protection layer 31 outside the unexposed region "C" (a photoresist-reserved region) may be etched off, as shown in FIG. 11. During the implementation, this step is optional, and of course, the second ion injection operation may be directly performed, like that in the first embodiment. To be specific, the second ion injection operation is performed on the portion of the p-Si layer corresponding to the LDD region at a relatively small dosage. In the case that the protection layer 31 above the LDD region is removed, it is able to control the dosage of the ions in a more accurate manner, thereby to improve the product quality. During the manufacture, the protection layer may be etched off using a hot phosphoric acid solution, or any other methods.

Figure 12:
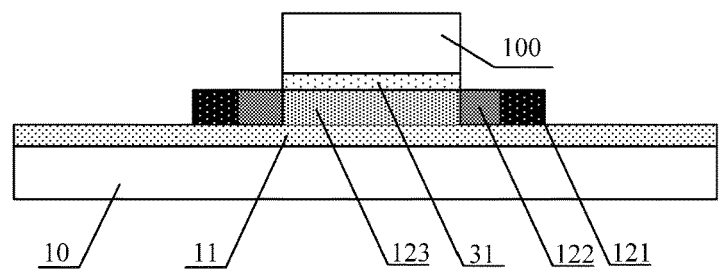
FIG. 12 is another schematic view showing the LTPS TFT after the formation of the lightly-drain-doped region according to the second embodiment of the present disclosure.

Next, the second ion injection operation may be performed on portions of the p-Si layer 22 corresponding to the fully-exposed region "A" and the partially-exposed region "B". The unexposed region "C" is shielded by the photoresist 100, i.e., the undoped region is protected by the photoresist, and the LDD region corresponding to the partially-exposed region and the HDD region corresponding to the fully-exposed region are not protected by the photoresist, so ions may enter the portions of the p-Si layer 22 corresponding to the fully-exposed region "A" and the partially-exposed region "B", so as to form the LDD region 122 between the HDD region 121 and the undoped region 123, as shown in FIG. 12. In the case of performing the ion injection operation on the portion of the p-Si layer 22 corresponding to the LDD region, the protection layer above the LDD region has been removed, so it is able to control the ion dosage in a more accurate manner, thereby to improve an injection effect.

Figure 13:
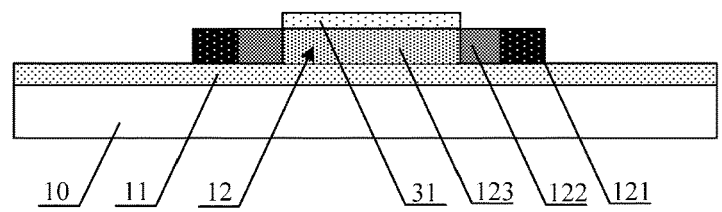
FIG. 13 is yet another schematic view showing the LTPS TFT after the formation of the pattern of the LTPS active layer according to the second embodiment of the present disclosure.

Then, the remaining photoresist may be removed, so as to form the patterns of the LTPS active layer 12 and the protection layer 31. The LTPS active layer 12 includes the undoped (n) region 123 in the middle, the HDD (n+) region 121 at two sides, and the LDD (n−) region 122 arranged between the undoped region 123 and the HDD region 121. The protection layer 31 covers the LTPS active layer 12, and the pattern of the protection layer 31 is substantially identical to the pattern of the LTPS active layer 12, as shown in FIG. 13.

Figure 14:
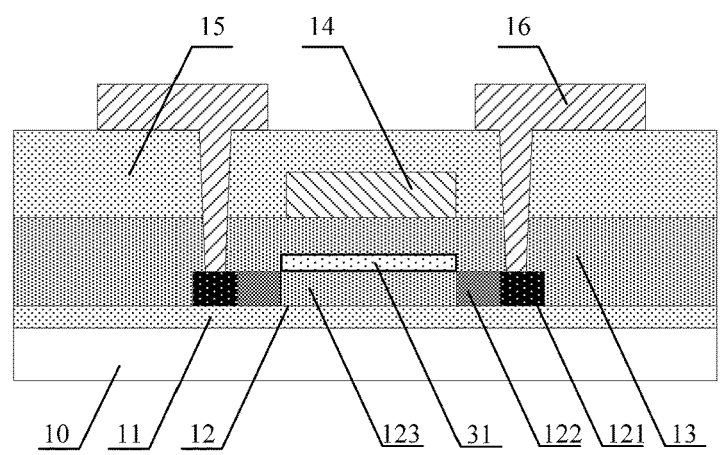
FIG. 14 is still yet another schematic view showing the LTPS TFT according to the second embodiment of the present disclosure.

Subsequently, patterns of a gate electrode, a source electrode and a drain electrode may be formed sequentially on the base substrate with the above-mentioned patterns. The step of forming the patterns of the gate electrode, the source electrode and the drain electrode includes the following steps. A first insulation layer 13 covering the entire base substrate 10 and a gate metal film may be deposited sequentially, the gate electrode 14 may be formed through a patterning process using a single-tone mask plate. Next, a second insulation layer 15 may be deposited in such a manner as to cover the gate electrode 14 and the entire base substrate 10, and an insulation layer via-hole may be formed above the HDD region 121 of the LTPS active layer 12 through a patterning process using a single-tone mask plate. The insulation layer via-hole penetrates through the second insulation layer 15 and the first insulation layer 13, so as to expose a surface of the HDD region 121. Then, a source/drain metal film may be deposited, and source/drain electrodes 16 may be formed through a patterning process using a single-tone mask plate. The source/drain electrodes 16 include the source electrode and the drain electrode arranged at two sides of a channel region respectively. The source electrode and the drain electrode are connected to the HDD region 121 of the p-Si active layer 12 through the insulation layer via-hole, so as to from the LTPS TFT, as shown in FIG. 14.

The LTPS TFT manufactured in this embodiment includes: the base substrate 10; the buffer layer 11 arranged on the base substrate 10; the LTPS active layer 12 arranged on the buffer layer 11 and including the undoped region 123, the LDD region 122 and the HDD region 121; the protection layer 31 arranged on the LTPS active layer 12, the protection layer 31 covering the undoped region 123 of the LTPS active layer 12; the first insulation layer 13 covering the protection layer 31 and the LTPS active layer 12; the gate electrode 14 arranged on the first insulation layer 13; the second insulation layer 15 covering the gate electrode 14; and the source/drain electrodes 16 arranged on the second insulation layer 15 and connected to the HDD region 121 of the LTPS active layer 12 through the insulation layer via-hole.

The LTPS TFT in this embodiment differs from that in the first embodiment in that, the protection layer 31 in the first embodiment covers the entire LTPS active layer 12, while in this embodiment the protection layer 31 merely covers the undoped region 123 of the LTPS active layer 12 and the pattern of the protection layer 31 is substantially identical to the pattern of the undoped region 123 of the LTPS active layer 12. In this embodiment of the present disclosure, a material, a thickness and a manufacture process of each of the layers is identical to those mentioned in the first embodiment, and thus will not be particularly defined herein.

Third Embodiment

Figure 15:
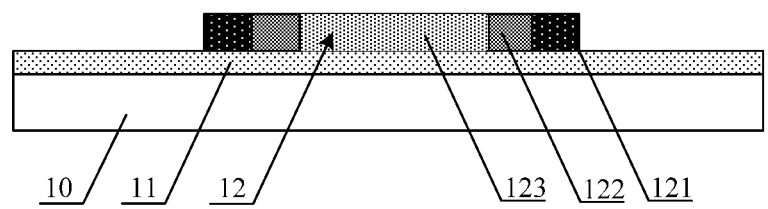
FIG. 15 is a schematic view showing the LTPS TFT after the formation of the pattern of the LTPS active layer according to the third embodiment of the present disclosure.
Figure 16:
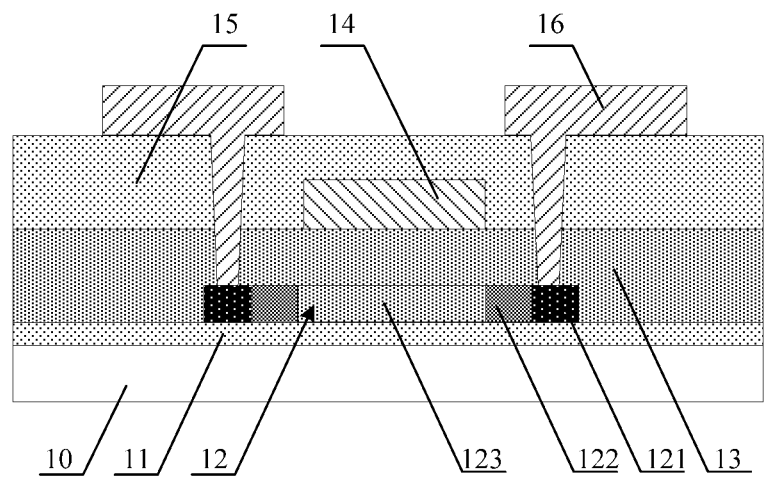
FIG. 16 is another schematic view showing the LTPS TFT according to the third embodiment of the present disclosure.

FIG. 15 and FIG. 16 are schematic views showing the manufacture of the LTPS TFT according to the third embodiment of the present disclosure. The third embodiment is an alternation of the second embodiment, and differs from the second embodiment in that, after the second ion injection operation, the protection layer is etched off first and then subsequent patterning processes are performed.

In this embodiment, a manufacture procedure from the step of depositing the buffer layer, the a-Si film and the protection film to the step of performing the removing operation of the photoresist maybe identical to that in the second embodiment, as shown in FIGS. 2 through 7 and FIGS. 10 through 13. During the ashing operation on the photoresist, due to the protection layer 31 on the HDD region 121, so it is able to effectively prevent the HDD region 121 of the p-Si layer from being directly bombarded with the $O_2$ plasmas, thereby to prevent the HDD region of the p-Si layer from being damaged and oxidized.

After the removing operation of the photoresist, the remaining protection layer 31 may be etched off, so as to form the LTPS active layer 12. The LTPS active layer 12 includes the undoped (n) region 123 in the middle, the HDD (n+) region 121 at two sides, and the LDD (n−) region 122 arranged between the undoped region 123 and the HDD region 121, as shown in FIG. 15. During the implementation, this step is optional, and of course, the second ion injection operation may be directly performed, like that in the second embodiment. To be specific, in the case that the LTPS active layer 12 is flat, it is able to facilitate the subsequent process and improve the product quality. During the manufacture, the protection layer may be etched off using a hot phosphoric acid solution, or any other methods.

Subsequently, patterns of a gate electrode, a source electrode and a drain electrode may be formed sequentially on the base substrate with the above-mentioned patterns. The step of forming the patterns of the gate electrode, the source electrode and the drain electrode includes the following steps. A first insulation layer 13 covering the entire base substrate 10 and a gate metal film may be deposited sequentially, the gate electrode 14 may be formed through a patterning process using a single-tone mask plate. Next, a second insulation layer 15 may be deposited in such a manner as to cover the gate electrode 14 and the entire base substrate 10, and an insulation layer via-hole may be formed above the HDD region 121 of the LTPS active layer 12 through a patterning process using a single-tone mask plate. The insulation layer via-hole penetrates through the second insulation layer 15 and the first insulation layer 13, so as to expose a surface of the HDD region 121. Then, a source/drain metal film may be deposited, and source/drain electrodes 16 may be formed through a patterning process using a single-tone mask plate. The source/drain electrodes 16 include the source electrode and the drain electrode arranged at two sides of a channel region respectively. The source electrode and the drain electrode are connected to the HDD region 121 of the p-Si active layer 12 through the insulation layer via-hole, so as to from the LTPS TFT, as shown in FIG. 16.

The LTPS TFT manufactured in this embodiment includes: the base substrate 10; the buffer layer 11 arranged on the base substrate 10; the LTPS active layer 12 arranged on the buffer layer 11 and including the undoped region 123, the LDD region 122 and the HDD region 121; the first insulation layer 13 covering the LTPS active layer 12; the gate electrode 14 arranged on the first insulation layer 13; the second insulation layer 15 covering the gate electrode 14; and the source/drain electrodes 16 arranged on the second insulation layer 15 and connected to the HDD region 121 of the LTPS active layer 12 through the insulation layer via-hole.

The LTPS TFT in this embodiment differs from that in the first and second embodiments in that, the protection layer 31 in the first and second embodiments is arranged on the LTPS active layer 12, while in this embodiment the protection layer 31 on the LTPS active layer 12 is fully removed. In this embodiment of the present disclosure, a material, a thickness and a manufacture process of each of the layers is identical to those mentioned in the first and second embodiments, and thus will not be particularly defined herein.

Fourth Embodiment

Based on an identical inventive concept, the present disclosure further provides in this embodiment an LTPS TFT manufactured by the above-mentioned method.

Based on an identical inventive concept, the present disclosure further provides in this embodiment a display substrate including the LTPS TFT manufactured by the above-mentioned method. The display substrate may be an array substrate.

Based on an identical inventive concept, the present disclosure further provides in this embodiment a display device including the above-mentioned LTPS TFTs or the display substrate. The display device may be any product or member having a display function, such as a mobile phone, a flat-panel computer, a television, a display, a laptop computer, a digital photo frame or a navigator. The display device may be a liquid crystal display (LCD) panel or an organic light-emitting diode (OLED) panel.

It should be appreciated that, such words as "in the middle", "on", "under", "front", "back", "vertical", "horizontal", "top", "bottom", "inside" and "outside" are merely used for simplifying the description, and they may merely each refer to a direction or a position relationship as shown in the drawings, but shall not be used to indicate or imply that the device or member must be arranged or operated at a specific position.

Unless otherwise defined, such words as "install", "connect" and "connected to" shall have the general meaning, e.g., they may each refer to: a fixed connection state, a removable connection state or an integral connection state; mechanical connection or electrical connection; or direct connection or indirect connection through an intermediate medium; or communication between two elements. The above-mentioned words may have the common meanings understood by a person of ordinary skills.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A method for manufacturing a low-temperature polysilicon (LTPS) thin film transistor (TFT), comprising steps of:
    depositing an amorphous silicon (a-Si) film and a protection film sequentially onto a base substrate;
    subjecting the a-Si film to crystallization so as to form a p-Si film;
    forming patterns of a p-Si layer and a protection layer through a patterning process, the pattern of the protection layer being substantially identical to the pattern of the p-Si layer;
    performing a first ion injection operation so as to inject ions through the protection layer into the p-Si layer, thereby to form a heavily-drain-doped region; and
    performing an ashing operation and performing a second ion injection operation, so as to form a pattern of an LTPS active layer including a heavily-drain-doped region, a lightly-drain-doped region and an undoped region.

2. The method according to claim 1, wherein—prior to the depositing an amorphous silicon (a-Si) film and a protection film sequentially onto a base substrate, the method further comprises depositing a buffer layer onto the base substrate.

3. The method according to claim 2, wherein the buffer layer is made of silicon nitride (SiNx), silicon oxide (SiOx) or silicone oxynitride (Si(ON)x).

4. The method according to claim 2, wherein the buffer layer is of a single-layered, double-layered or multi-layered structure.

5. The method according to claim 2, wherein the a-Si film is subjected to crystallization using a laser beam, so as to form the p-Si film.

6. The method according to claim 2, wherein the step of performing the first ion injection operation so as to inject the ions through the protection layer into the p-Si layer, thereby to form the heavily-drain-doped region comprises:
    applying a photoresist onto the base substrate with the patterns of the p-Si layer and the protection layer, and exposing and developing the photoresist using a halftone mask plate or a grey-tone mask plate, so as to form an unexposed region corresponding to the undoped region, a partially-exposed region corresponding to the lightly-drain-doped region, and a fully-exposed region corresponding to the other regions comprising the heavily-drain-doped region; and
    performing the first ion injection operation, so as to inject the ions through the protection layer into a portion of the p-Si layer corresponding to the fully-exposed region, thereby to form the heavily-drain-doped region.

7. The method according to claim 6, wherein the step of performing the ashing operation and performing the second ion injection operation, so as to form the pattern of the LTPS active layer comprising the heavily-drain-doped region, the lightly-drain-doped region and an undoped region comprises:
    performing the ashing operation on the photoresist and removing the photoresist corresponding to the partially-exposed region;
    performing the second ion injection operation so as to inject the ions into a portion of the p-Si layer corresponding to the partially-exposed region, thereby to form the lightly-drain-doped region; and
    removing the remaining photoresist, so as to form the pattern of the LTPS active layer comprising the heavily-drain-doped region, the lightly-drain-doped region and the undoped region.

8. The method according to claim 7, wherein prior to performing the second ion injection operation, the method further comprises etching off portions of the protection layer corresponding to the fully-exposed region and the partially-exposed region.

9. The method according to claim 7, wherein subsequent to the step of removing the remaining photoresist, the manufacturing method further comprises etching off a portion of the protection layer corresponding to the unexposed region.

10. The method according to claim 6, wherein the photoresist at the unexposed region corresponding to the undoped region has a first thickness, the photoresist at the partially-exposed region corresponding to the lightly-drain-doped region has a second thickness, no photoresist is located at the fully-exposed region corresponding to the regions including the heavily-drain-doped region, and the first thickness is substantially greater than the second thickness.

11. The method according to claim 6, wherein the heavily-drain-doped region and the lightly-drain-doped region are formed through one single patterning process using a halftone mask plate or a grey-tone mask plate.

12. The method according to claim 6, wherein another lightly-drain-doped region is added between the heavily-drain-doped region and the undoped region.

13. The method according to claim 1, wherein the protection layer is made from a group of silicon nitride, silicon oxide or both, and in the case that the protection layer is a composite film made of silicon nitride and silicon oxide, it has a thickness of 5 nm~20 nm.

14. The method according to claim 13, wherein the composite film approximately has a thickness of 10 nm.

15. The method according to claim 1, further comprising forming patterns of a gate electrode, a source electrode and a drain electrode.

16. The method according to claim 15, wherein the step of forming the patterns of the gate electrode, the source electrode and the drain electrode comprises:
    depositing a first insulation layer and a gate metal film sequentially, and forming the gate electrode through a patterning process;
    depositing a second insulation layer, and forming an insulation layer via-hole through a patterning process; and
    depositing a source/drain metal film and forming the source electrode and the drain electrode through a patterning process, the source electrode and the drain electrode being connected to a portion of a p-Si active layer corresponding to the heavily-drain-doped region.

17. The method according to claim 1, wherein N-type ions are used for the second ion injection operation.

18. The method according to claim 17, wherein the N-type ions are phosphorus ions.

* * * * *